United States Patent [19]
Bohnert et al.

[11] Patent Number: 5,945,667
[45] Date of Patent: Aug. 31, 1999

[54] METHOD FOR TEMPERATURE COMPENSATION OF MEASURING SIGNALS OF A FIBER-OPTIC SENSOR

[75] Inventors: Klaus Bohnert, Niederrohrdorf; Pascal Péquignot, Fislisbach, both of Switzerland

[73] Assignee: ABB Research Ltd., Zurich, Switzerland

[21] Appl. No.: 09/005,044

[22] Filed: Jan. 9, 1998

[30] Foreign Application Priority Data

Jan. 16, 1997 [DE] Germany .......................... 197 01 221

[51] Int. Cl.$^6$ ...................................... G01J 4/00
[52] U.S. Cl. .............................. 250/227.14; 250/227.17; 324/96
[58] Field of Search .................. 250/227.14, 227.17, 250/227.21, 227.23; 324/96, 72, 72.5, 244.1; 385/12, 13

[56] References Cited

U.S. PATENT DOCUMENTS

| | | |
|---|---|---|
| 5,053,693 | 10/1991 | Bohnert et al. . |
| 5,339,026 | 8/1994 | Bohnert .............................. 250/227.14 |

FOREIGN PATENT DOCUMENTS

| | | |
|---|---|---|
| 0433824B1 | 3/1994 | European Pat. Off. . |
| 4128687A1 | 3/1993 | Germany . |
| 4216152A1 | 11/1993 | Germany . |

OTHER PUBLICATIONS

"Coherence–Tuned Interrrogation of a Remote Elliptical–Core, Dual–Mode Fiber Strain Sensor", Bohnert, et al., *Journal of Lightwave Technology*, vol. 13, No. 1, Jan. 1995, pp. 94–103.

*Primary Examiner*—Edward P. Westin
*Assistant Examiner*—Kevin Pyo
*Attorney, Agent, or Firm*—Burns, Doane, Swecker & Mathis, L.L.P.

[57] ABSTRACT

The piezoelectric effect of an optical sensor (6) made from quartz is a function of temperature. Without correcting or compensating measures, this temperature dependence leads to a falsification of the measuring signal if the temperature of the sensor element is not held constant. In order to obtain accurate measurements for variable sensor temperatures $T_s$, a temperature-corrected measuring signal M is provided in accordance with:

$$M = U13 \cdot (1 + \alpha \cdot (T_0 - T_s)),$$

U13 signifying a control signal, $T_0$ a prescribable calibration temperature of the sensor (6), and α the temperature coefficient of the sensor (6). In this case, the sensor temperature ($T_s$) is calculated in accordance with:

$$T_s = f(K, E(U_{Tr})),$$

K being a contrast parameter which is calculated from light power signals (U1, U2), is a function of the sensor temperature ($T_s$) and is proportional to the interference contrast, and $U_{Tr}$ signifying a signal receiver temperature signal and $T_r$ signifying a signal receiver temperature. The contrast parameter (K) is arrived at by virtue of the fact that an oscillator signal ($U_{HF}$) of prescribable amplitude is superimposed on a control signal (U13) of a differential voltage regulator (11), the frequency (f) of said oscillator signal being at least so high that a light modulation effected in the receiving fiber (r) by the oscillator signal ($U_{HF}$) is not compensated by the differential voltage regulator (11).

8 Claims, 2 Drawing Sheets

METHOD FOR TEMPERATURE COMPENSATION OF MEASURING SIGNALS OF A FIBER-OPTIC SENSOR

BACKGROUND OF THE INVENTION

1. Field of the Invention

The invention proceeds from a method for temperature compensation of measuring signals of a fiber-optic sensor according to the preamble of patent claim 1.

2. Discussion of Background

In the preamble of patent claim 1, the invention refers to a prior art as is disclosed by K. Bohnert et al. in Coherence-Tuned Interrogation of a Remote Elliptical Core, Dual-Mode Fiber Strain Sensor, JOURNAL OF LIGHTWAVE TECHNOLOGY, Vol. 13, No. 1, January 1995, pages 94–103. Described there are two fiber-optic measuring devices for measuring electric alternating voltages, in which the electric voltage is applied to a cylindrical quartz crystal. A resulting, periodic, piezoelectric deformation or change in circumference of the quartz crystal is transmitted to a two-mode glass fiber as sensor fiber. The periodic expansion of the sensor fiber caused thereby leads to a modulation of the phase difference between the two spatial, optical modes $LP_{01}$ and $LP_{11}$ (even) which are propagated in the sensor fiber. This phase modulation is proportional to the applied electric voltage. For the purpose of measurement, light is guided from a multimode laser via a single-mode fiber to the sensor fiber, and a further single-mode fiber and two modulators with a two-mode fiber as receiving fiber to 2 photodiodes which detect the interference pattern of the two modes. The differential, optical phase of the modes of the receiving fiber is controlled with the aid of an electronic control loop and two piezoelectric modulators in such a way that the phase modulation in the sensor fiber is precisely compensated again. The control voltage produced in the control loop and applied to the piezoelectric modulators is thus an image of the electric voltage to be measured. Instead of being operated in transmission, the sensor fiber can also be operated in reflection. An essential feature of the sensor consists in that disturbances do not impair the measuring signal through temperature fluctuations and mechanical vibrations acting on the connecting fibers between the transceiver unit and the sensor head. Changes in the length of the sensor and receiving fibers as a consequence of temperature changes likewise lead to optical phase shifts. However, as a rule, these are so slow that there is no problem in separating them from the periodic, electrically induced phase changes.

The piezoelectric effect in quartz is a function of temperature. Given a rise in temperature of the quartz, for example from 0° C. to 100° C., the sensor signal decreases by 2.15%. Without a correcting or compensating measure, this temperature dependence leads to a falsification of the measuring signal if the temperature of the sensor element is not held constant.

SUMMARY OF THE INVENTION

Accordingly, one object of the invention, as defined in patent claim 1, is to provide a novel method for temperature compensation of measuring signals of a fiber-optic sensor.

Advantageous embodiments of the invention are defined in the dependent patent claims.

One advantage of the invention consists in that the accuracy of measurements by means of a fiber-optic sensor can be improved when the temperature of the latter is not held constant.

It is possible to dispense with a separate temperature detector on the sensor head. The sensor head and electronic part of the sensor can thus be isolated electrically.

The temperature of the sensor is determined from the interference contrast. Temperature changes change the length and optical parameters of the sensor fiber, and thus the optical path difference which the two modes in the optical fiber accumulate. The consequence of this is, in turn, a change in the interference contrast at the end of the receiver fiber. The lengths of the sensor fiber and receiving fiber are selected such that a unique relationship results between the contrast and temperature.

In order to measure the interference contrast, an additional alternating signal which has a constant amplitude and whose frequency is above the bandwidth of the control loop is fed into the piezoelectric modulator of the control loop. The resulting modulation of the phase difference between the two modes is then not compensated by the control loop. The amplitude of the corresponding modulation of the light intensity at the two photodiodes is proportional to the interference contrast. The alternating signal is normalized to the DC component of the light intensity at the two photodiodes, in order to compensate any fluctuations in the DC component of the light intensity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
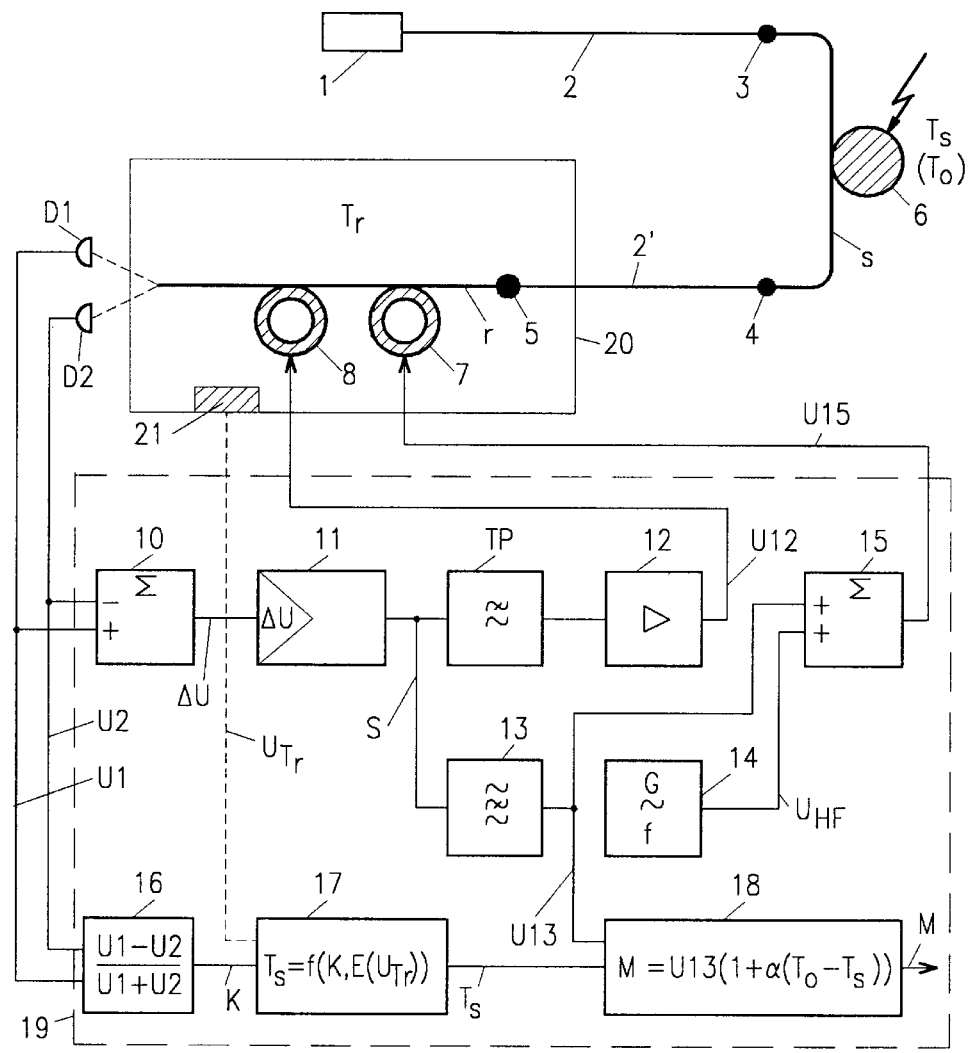
FIG. 1 shows a diagram of a fiber-optic measuring device with a two-mode sensor fiber in a transmission arrangement.

Referring now to the drawings, wherein like reference numerals designate identical or corresponding parts throughout the several views, FIG. 1 is a diagram of a fiber-optic measuring device with a quartz cylinder or a piezoelectric sensor element (6) made from quartz and having a two-mode glass fiber or optical fiber or sensor fiber (s) wound on the cylindrical circumference thereof, in a transmission arrangement. The two-mode sensor fiber (s) used has an elliptical fiber core (22) with mutually orthogonal optical main axes (x', y'). The fiber core (22) is surrounded by a fiber cladding (23), compare FIG. 2, left. An $LP_{01}$ fundamental mode and an even $LP_{11}$ mode can be propagated at a prescribed wavelength. These modes are excited with a polarization parallel to the major main axis (x') or parallel to the minor main axis (y'). The excited modes are denoted correspondingly by ($LP_{01}$(x')), ($LP_{11}$(x')) or ($LP_{01}$(y')) and ($LP_{11}$(y')), compare FIG. 2, middle and right.

Figures 2, 3:
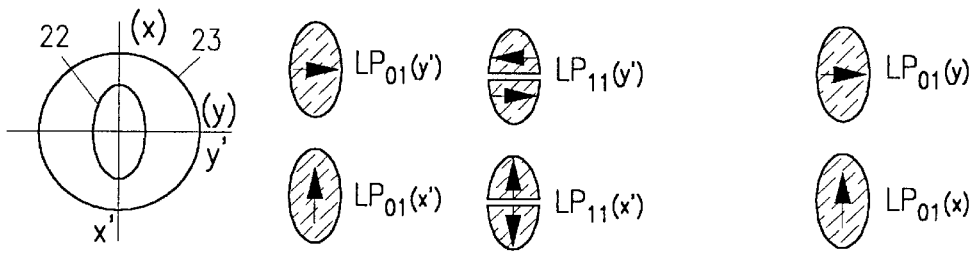
FIGS. 2 and 3 show excitable optical modes of a sensor fiber and a feed fiber in accordance with FIG. 1.

From a low-coherence light source (1), for example a multimode laser diode, light is fed via a glass fiber connection or a splice (3) to the sensor fiber (s) via a highly birefringent, and thus polarization-preserving single-mode glass fiber or single-mode optical fiber or feed fiber (2) with 2 mutually orthogonal optical main axes (x, y), whose orientation is specified in brackets in FIG. 2. In the single-mode optical fiber (2), the light is polarized parallel to one of the optical main axes (x, y) of the elliptical fiber core (22). The feed fiber (2) and the sensor fiber (s) are spliced together in the splice (3) such that their optical main axes (x, y; x', y') are at an angle of 0° or 90° relative to one another. The optical main axes (x, y; x', y') of these two spliced fibers (2, s) may, if need be, deviate from this angle by a tolerable differential angle (ε) of $\leq 30°$, preferably of $\leq 10°$.

Depending on the polarization direction of the light in the feed fiber (2) and the angle between the optical main axes (x, y; x', y') in the splice (3), the modes ($LP_{01}$) and ($LP_{11}$) of the sensor fiber (s) are excited with the polarization parallel either to (x') or (y'). The two fibers (2, s) are, furthermore, spliced together with a lateral offset of the fiber cores (22) parallel to the major main axis (x') of the fiber core (22) of the sensor fiber (s). The offset is such that the two modes ($LP_{01}$) and ($LP_{11}$) of the sensor fiber (s) are excited with approximately the same amplitude.

The sensor fiber (s) is operationally connected to a piezoelectric sensor element (6), for example a quartz cylinder, which is acted upon by an electric field of which the amplitude is to be measured and which is indicated by a lightning symbol.

After traversing the sensor fiber (s), the light is launched via a splice (4) into a further polarization-preserving single-mode optical fiber or return fiber (2') and launched from the latter via a further splice (5) into a two-mode optical fiber or receiving fiber (r).

The same holds for the orientation of the optical main axes in the splice (4) as for the splice (3). Likewise, the fibers (s, 2') are spliced together with a lateral offset of the fiber cores (22) in such a way that the two modes ($LP_{01}$) and ($LP_{11}$) of the sensor fiber (s) are launched into the return fiber (2') in the same proportions. The splice (5) is designed like the splice (3).

The receiving fiber (r) is wound around the first and second hollow cylinders made from a piezoelectric ceramic, or around piezoelectric modulators (7, 8); it is connected optically at the output end to 2 optoelectric detectors or photodiodes or light detectors (D1, D2), which in each case deliver on the output side an output voltage (U1) or (U2) which is proportional to the received light power. The light detectors (D1, D2) are arranged such that they both in each case detect one of the two antiphased substructures of the interference pattern.

The two spatial modes ($LP_{01}$) and ($LP_{11}$) of the sensor fiber (s) accumulate a path difference $\Delta L_s = l_s \cdot \Delta n_{g,s}$, $l_s$ being the length of the sensor fiber (s) and $\Delta n_{g,s}$ being the difference between the group indexes of the two modes.

The two spatial modes of the receiving fiber (r)— depending on the orientation of the sensor fiber (s) in the splice (5) and the polarization direction in the return fiber (2'), these are either the $LP_{01}(x')$ mode and the even $LP_{11}(x')$ mode or the $LP_{01}(y')$ mode and the even $LP_{11}(y')$ mode— accumulate a path difference of:

$$\Delta L_r = l_r \cdot \Delta n_{g,r},$$

$l_r$ being the length of the receiving fiber (r) and $\Delta n_{g,r}$ being the difference between the group indexes of the two modes. The fiber lengths $l_s$ and $l_r$ are selected such that $\Delta L_s$ and $\Delta L_r$ are the same within the coherence length of the light source (1).

At the end of the receiving fiber (r) there are light waves with a relative path difference of $\Delta L_r - \Delta L_s \approx 0$, which interfere with one another coherently, and lightwaves with relative path differences of $\Delta L_s$ and $\Delta L_r$ (where $\Delta L_s = \Delta L_r$) and $\Delta L_s + \Delta L_r$, which interfere incoherently and supply only a constant background to the interference pattern. It is important that $\Delta L_s$ and $\Delta L_r$ are distinctly larger than the coherence length of the light source (1).

An accumulated optical path difference of approximately 3.3 mm for a wavelength of 780 nm was measured for the two spatial modes in a sensor fiber (s) or a receiving fiber (r) with a nominal length of 4 μm for the major main axis of the fiber core (14), a length of the minor main axis of 2 μm, a nominal refractive difference between the fiber core (14) and fiber cladding (15) of 0.03 and a fiber length of 1 m. The difference between the group indexes of the two modes ($LP_{01}$) and ($LP_{11}$) of the sensor fiber (s) and the receiving fiber (r) is a function of the wavelength. In particular, there is a wavelength for which $\Delta n_{g,s}$ and $\Delta n_{g,r}$ are equal to 0. The group index difference usually exhibits a weak dependence on the polarization direction of the light. This effect is typically less than 2%.

The sensitivity of the fibers, that is to say the differential phase change for a given change in length of the fiber, is a function of the difference between the refractive indexes of the fiber core (22) and fiber cladding (23), the core size and core shape and the wavelength. For fibers with an elliptical fiber core (22) of the above-named type, a change in length of approximately 100 μm is required for a phase shift of 2 π between the spatial modes ($LP_{01}$) and ($LP_{11}$) given a wavelength of 780 nm.

A subtractor (10), which on the input side is fed the output voltages (U1) and (U2) of the light detectors (D1, D2), supplies on the output side a differential voltage ($\Delta U$) to a regulator or differential voltage regulator (11), which regulates the differential voltage ($\Delta U$) to 0. This differential voltage regulator (11) supplies on the output side a signal (S) which contains both a DC voltage component and an AC voltage component. This signal (S) passes via a low-pass filter (TP) to a DC voltage amplifier (12) which on the output side transmits a compensation voltage (U12) to a modulator (8). The signal (S) is fed furthermore to a stop filter (13) for the resonant frequency of a modulator (7), which on the output side transmits a compensation voltage (U13) to the modulator (7) via an adder (15). The stop filter (13) has the task of preventing oscillation of the control loop at the resonant frequency of the modulator (7). The compensation voltage (U13) is proportional to the electric AC voltage to be measured, but is not temperature-compensated, and may thus be defective.

The optical phase shift caused by a given voltage present at the sensor (6) is a function of the temperature of the sensor element (6), of the geometry of the latter, of the type of the sensor fiber (s) and of the length of the optical fiber segment connected to the sensor (6). The compensation voltage (U13) for compensating a given phase shift is a function of the geometry and of the material of the modulator (7), of the type of the receiving fiber (r), of the length of the optical fiber segment connected to the modulator (7), and of a signal receiver temperature ($T_r$) which is equal to the temperature of the modulator (7). The modulator (7) can, for example, be designed such that a compensation voltage (U13) of ±3 V effects a differential optical phase shift of ±10° between the modes ($LP_{01}$) and ($LP_{11}$) of the receiving fiber (r). The temperature dependence of the inverse piezoelectric effect of the sensor (6) is expressed, for a given voltage present at the sensor (6), as a corresponding change with temperature in the compensation voltage (U13) required for compensation.

For compensation of the temperature dependence, there is superimposed on the compensation voltage (U13) in the adder (15) an oscillator signal ($U_{HF}$) of constant amplitude from the output of a radio-frequency oscillator (14), whose frequency (f) is above the bandwidth of the control loop of the differential voltage regulator (11), preferably in the frequency range between 50 kHZ and 1 MHZ. The oscillator signal ($U_{HF}$) is then not compensated by the control loop of the differential voltage regulator (11).

The amplitude of the resulting modulation of the light intensity at the two light detectors (D1, D2) is proportional to an interference contrast $$V=(U1_{max}-U2_{min})/(U1_{max}+U2_{min}),$$

$U1_{max}$ and $U1_{min}$ being the intensities of the maxima and minima of an interference fringe pattern.

In order to obtain a signal which is independent of fluctuations in the light power of the multimode laser (1), a contrast parameter $$K=(U1-U2)/(U1+U2)$$

is formed in a divider (16). The contrast parameter (K) differs from the interference contrast (V) only by a constant factor. On the input side, the divider (16) is fed the output voltages (U1) and (U2) of the light detectors (D1, D2), which contain spectral components with the frequency (f) of the radio-frequency oscillator (14).

Figure 4:
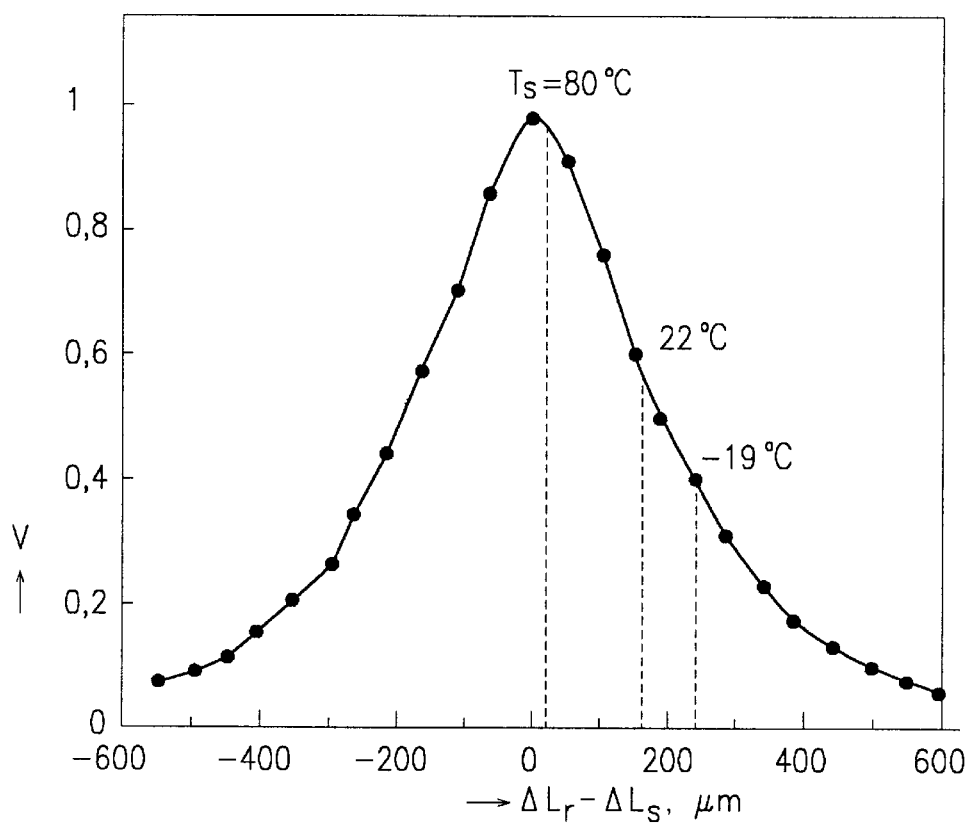
FIG. 4 shows a calibration curve for a prescribable temperature of a signal receiver of the measuring device in accordance with FIG. 1, as a function of the difference between the accumulated path differences in the sensor fiber and a receiving fiber.
Figure 5:
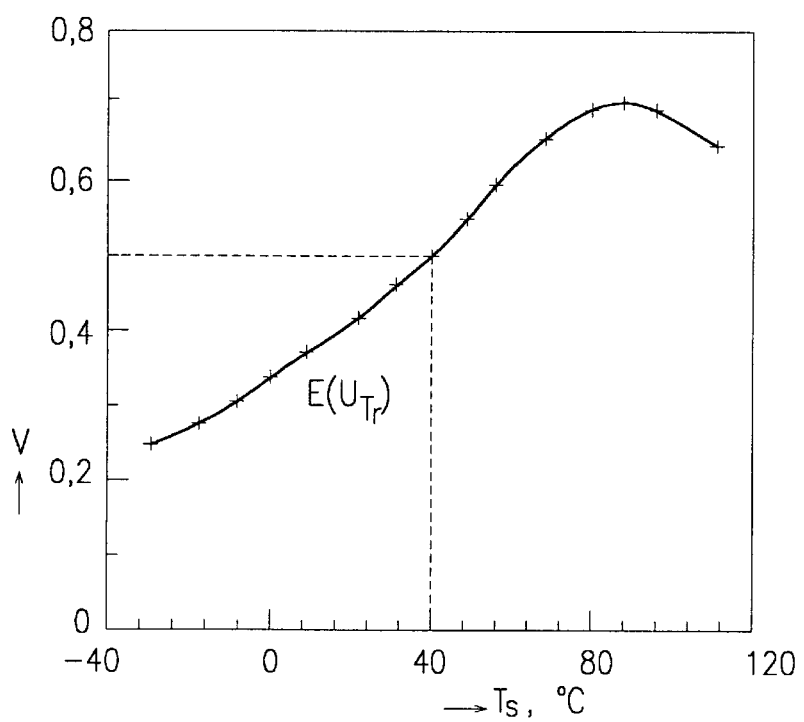
FIG. 5 shows a calibration curve for a prescribable temperature of the signal receiver of the measuring device in accordance with FIG. 1, as a function of the temperature of the sensor fiber.

Depending on the sensor temperature ($T_s$), there is a change in a relative path difference $\Delta L_r - \Delta L_s$, which is specified in FIG. 4 on the abscissa in m, and thus also in the interference contrast (V), which is specified on the ordinate. It is possible to derive from the curve in FIG. 4 a calibration curve (E), compare FIG. 5, which specifies the relationship between the sensor temperature ($T_s$) and the interference contrast (V). The data in FIGS. 4 and 5 were measured at a constant signal receiver temperature ($T_r$) of 22° C. If the signal receiver temperature ($T_r$) is not held constant, but varies, there is also a variation in an optically accumulated path difference $\Delta L_r$ of the receiving fiber (r), and thus in the calibration curve (E). This is taken into account by measuring the signal receiver temperature ($T_r$) by means of a temperature-dependent resistor or temperature detector (21) which is fitted on an optical signal receiver (20) which comprises the modulators (7, 8), the receiving fiber (r) and the splice (5). The temperature detector (21) supplies a signal receiver temperature signal ($U_{Tr}$), which is proportional to a signal receiver temperature ($T_r$) and is supplied to a signal characterizer (17) together with the contrast parameter (K) of the divider (16). Depending on the contrast parameter (K) and the signal receiver temperature signal ($U_{Tr}$), said signal characterizer calculates the sensor temperature ($T_s$) of the sensor fiber (s) in accordance with:

$$T_s=f(K,E(U_{Tr})).$$

The sensor temperature ($T_s$) is 40° C. for $T_r$=22° C. in the case of an interference contrast (V) of, for example, 0.5.

The amount by which the relative path difference $\Delta L_r - \Delta L_s$, and thus the interference contrast (V), vary in a given temperature interval can be influenced via the length of the optical fibers and the selection of their optical parameters. Moreover, the intensity of the change in contrast can be influenced via the selection of the light source. The more the light source (1) is of low coherence, the narrower the curve in FIG. 4 and the higher the change in contrast in a given temperature interval. Light sources (1) which are of particularly low coherence and can be effectively coupled to monomode optical fibers are so-called superluminescence diodes and laser diodes operated below the threshold current. However, it is to be observed that the interference contrast (V) remains sufficiently high, preferably >0.2, over the entire temperature range, to ensure a satisfactory sensor accuracy for all operating temperatures.

In practice, it is relatively easy to fulfill the requirement for a constant signal receiver temperature ($T_r$), since this receiving fiber (r) is a part of the signal receiver (20).

The sensor temperature ($T_s$) which can be tapped on the output side at the signal characterizer (17) is fed together with the compensation voltage (U13) to a further signal characterizer (18), which supplies a temperature-corrected measuring signal (M) on the output side in accordance with:

$$M=U13\cdot(1+\alpha\cdot(T_0-T_s)),$$

$T_0$ signifying the calibration temperature of the sensor fiber (s), for example 22° C., and $\alpha$ signifying the temperature coefficient of the sensor element (6). It holds for a sensor element (6) made from quartz that $\alpha=-2.15\cdot10^{-4}K^{-1}$.

It goes without saying that the signal receiver temperature ($T_r$) need not be detected if it is known and is held constant.

The functions of the low-pass filter (TP) and of the devices (10)–(18) can be carried out by means of a computer or microprocessor (19). There is a need in this case to provide an analog/digital converter on the input side and a digital/analog converter on the output side (not represented). Consequently, it is possible by means of a program exchange in the microprocessor (19) to realize the temperature compensation according to the invention in a simple way in the case of existing measuring devices with fiber-optic sensors.

Instead of the two-mode sensor fiber (s), it is also possible in principle to use a polarimetric optical fiber. A polarimetric optical fiber has two mutually orthogonal optical main axes (x', y') perpendicular to the fiber direction. It is possible at a prescribed wavelength for the two orthogonal polarization states ($LP_{01}(x')$) and ($LP_{01}(y')$) of the $LP_{01}$ fundamental mode to be propagated with polarizations parallel to the optical main axes (x', y'). The effective refractive indices for the two polarizations are different, that is to say the optical fiber is birefringent.

The two orthogonal polarization states ($LP_{01}(x')$) and ($LP_{01}(y')$) of the sensor fiber (s) accumulate a path difference of $\Delta L_s = l_s \cdot \Delta n_{g,s}$, $l_s$ being the length of the sensor fiber (s) and $\Delta n_{g,s}$ being the difference between the group indexes of the orthogonal polarization states ($LP_{01}(x')$) and ($LP_{01}(y')$) of the sensor fiber (s). The fiber lengths $l_s$ and $l_r$ of the sensor fiber (s) or of the receiver fiber (r) are, in turn, selected such that $\Delta L_s$ and $\Delta L_r$ are the same within the coherence length of the multimode laser (1).

In the splices (3) and (4), the optical main axes (x', y') of the sensor fiber (s) form an angle of 45°±ε with the optical main axes (x, y) of the feed fiber (2) and return fiber (2').

In a further possible configuration, both the sensor fiber (s) and the receiving fiber (r) are polarimetric fibers. In this case, in all the splices (3–5) the optical main axes (x, y; x', y') of the fibers form an angle of 45°±ε. At the end of the receiving fiber (r), the two orthogonal polarization states of the receiving fiber (r) are brought into interference, for example with the aid of a Wollaston prism (not represented), and the two resulting signals are fed to the light detectors (D1, D2).

It goes without saying, furthermore, that it is also possible instead of quartz cylinders and piezoceramics to use other piezoelectric components as sensor element (6) and as modulators (7, 8, 22, 22').

The feed fiber (2) and the return fiber (2') can be omitted in principle. The polarized light could, for example, be transmitted through the air or through a vacuum and be launched into the optical fibers with the aid of lenses.

The contribution of the sensor fiber (s) to the temperature dependence of the compensation voltage (U13) is negligible in the case of the use of a suitable fiber cladding (23), for example made from a thin polyamide.

Instead of the electric voltage, it is also possible to measure another physical variable, if it effects a change in length of the sensor fiber (s) which can be uniquely assigned to this physical variable.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A method for temperature compensation of measuring signals of a fiber-optic sensor,
   a) in which, for the purpose of detecting a physical variable, light is guided through an optical sensor fiber to an optical receiving fiber,
   b) the light in the sensor fiber and in the receiving fiber propagating in two different spatial modes or in two orthogonal polarization states of one spatial mode,
   c) an interference pattern of the spatial modes or of the orthogonal polarization states being detected at an end of the receiving fiber by means of two light detectors (D1, D2) which supply on their output sides, first and second light power signals (U1, U2) each of which is proportional to light power received by the corresponding one of the two light detectors (D1, D2),
   d) a difference ($\Delta U$) between the first and second light power signals (U1, U2) is supplied to the input of a differential voltage regulator which supplies a control signal (U13) on its output side,
   e) which acts on a modulator which is operationally connected to the receiving fiber, and controls the differential optical phase of the spatial modes or of the orthogonal polarization states of the receiving fiber in such a way that the difference ($\Delta U$) vanishes, wherein
   f) superimposed on the control signal (U13) is an oscillator signal ($U_{HF}$) of prescribable amplitude, having a frequency that is at least so high that a light modulation of the frequency effected in the receiving fiber by the oscillator signal ($U_{HF}$) is not compensated by the differential voltage regulator,
   g) a contrast parameter (K) is calculated as a function of the first and second light power signals (U1, U2) in accordance with:

$$K=(U1-U2)/(U1+U2),$$

h) a signal receiver temperature ($T_r$) is measured by means of a temperature detector,
   i) a sensor temperature ($T_s$) is determined as a function of this contrast parameter (K) and a temperature calibration function $E(T_r)$ in accordance with: $T_s=f(K, E(T_r))$, and
   j) a temperature-corrected measuring signal (M) is provided as a function of this sensor temperature ($T_s$) and the control signal (U13) in accordance with:

$$M=U13\cdot(1+\alpha\cdot(T_0-T_s)),$$

($T_0$) signifying a prescribable calibration temperature of the sensor fiber and $\alpha$ signifying the temperature coefficient of the fiber-optic sensor.

2. The method as claimed in claim 1, wherein
   a) the amplitude of the oscillator signal ($U_{HF}$) is held constant, and
   b) the frequency of the oscillator signal ($U_{HF}$) is in a frequency band of 50 kHz–1 MHz.

3. The method as claimed in claim 1, wherein the signal receiver temperature ($T_r$) is held constant at a prescribable temperature value.

4. The method as claimed in claim 1, wherein
   a) the sensor fiber is a double-mode fiber in which an $LP_{01}$ fundamental mode and an even $LP_{11}$ mode are propagated, and
   b) the receiving fiber is a double-mode fiber in which the $LP_{01}$ fundamental mode and the even $LP_{11}$ mode are propagated.

5. The method as claimed in claim 1, wherein
   a) the sensor fiber is a polarimetric fiber in which the two orthogonal polarization states of an $LP_{01}$ fundamental mode are propagated, and
   b) the receiving fiber is a double-mode fiber in which the $LP_{01}$ fundamental mode and an even $LP_{11}$ mode are propagated.

6. The method as claimed in claim 1, wherein
   a) the sensor fiber is a polarimetric fiber in which the two orthogonal polarization states of an $LP_{01}$ fundamental mode are propagated, and
   b) the receiving fiber is a polarimetric fiber in which the two orthogonal polarization states of the $LP_{01}$ fundamental mode are propagated.

7. The method according to claim 1, wherein
   a) the contrast parameter (K) is determined as a function of the sensor temperature ($T_s$) and
   b) as a function of an accumulated, relative optical path difference $$\Delta L_r - \Delta L_s$$

where $$\Delta L_r = l_r \cdot \Delta n_{g,r},$$

$l_r$ being the length of the receiving fiber, and $\Delta n_{g,r}$ being a difference between group indexes of the two modes, either the $LP_{01}(x')$ mode and the even $LP_{11}(x')$ mode or the $LP_{01}(y')$ mode and the even $LP_{11}(y')$ mode, in the case of a double-mode fiber, depending on polarization in a direction of their optical main axes (x', y') or the $LP_{01}(x')$ mode and the $LP_{01}(y')$ mode, in the case of a polarimetric fiber, and where $$\Delta L_s = l_s \cdot \Delta n_{g,s},$$

$l_s$ being a length of the sensor fiber and $\Delta n_{g,s}$ being a difference between the group indexes of the two modes, either the $LP_{01}(x')$ mode and the even $LP_{11}(x')$ mode or the $LP_{01}(y')$ mode and the even $LP_{11}(y')$ mode, in the case of a double-mode fiber, depending on the polarization in the direction of one of the optical main axes (x', y') or the $LP_{01}(x')$ mode and the $LP_{01}(y')$ mode, in the case of a polarimetric fiber.

8. The method as claimed in claim 7, wherein the contrast parameter (K) is additionally determined as a function of the signal receiver temperature ($T_r$).

* * * * *